(12) United States Patent
Nishikawa

(10) Patent No.: US 8,252,511 B2
(45) Date of Patent: Aug. 28, 2012

(54) METHOD FOR MODIFYING FIRST FILM AND COMPOSITION FOR FORMING ACID TRANSFER RESIN FILM USED THEREFOR

(75) Inventor: Kouji Nishikawa, Tokyo (JP)

(73) Assignee: JSR Corporation, Tokyo (JP)

( * ) Notice: Subject to any disclaimer, the term of this patent is extended or adjusted under 35 U.S.C. 154(b) by 22 days.

(21) Appl. No.: 12/962,672

(22) Filed: Dec. 8, 2010

(65) Prior Publication Data

US 2011/0076619 A1 Mar. 31, 2011

Related U.S. Application Data

(63) Continuation of application No. PCT/JP2009/061886, filed on Jun. 29, 2009.

(30) Foreign Application Priority Data

Jul. 17, 2008 (JP) .................................. 2008-186554

(51) Int. Cl.
*G03F 7/00* (2006.01)
*G03F 7/004* (2006.01)
*G03F 7/11* (2006.01)
*G03F 7/40* (2006.01)

(52) U.S. Cl. ............... 430/273.1; 430/270.1; 430/271.1; 430/330; 430/331

(58) Field of Classification Search ............... 430/270.1, 430/271.1, 273.1, 330, 331, 312
See application file for complete search history.

(56) References Cited

U.S. PATENT DOCUMENTS

| 5,565,302 | A | * | 10/1996 | Samukawa et al. | ......... 430/281.1 |
|---|---|---|---|---|---|
| 7,005,231 | B2 | * | 2/2006 | Tamaki et al. | ............. 430/270.1 |
| 7,267,927 | B2 | * | 9/2007 | Shibata et al. | ................ 430/296 |
| 7,288,364 | B2 | | 10/2007 | Jung et al. | |
| 7,534,550 | B2 | * | 5/2009 | Shimizu et al. | ............ 430/270.1 |
| 7,604,911 | B2 | * | 10/2009 | Hata et al. | ........................ 430/14 |
| 7,745,077 | B2 | * | 6/2010 | Thiyagarajan et al. | ......... 430/14 |
| 7,923,200 | B2 | * | 4/2011 | Thiyagarajan et al. | ........ 430/313 |
| 7,964,332 | B2 | * | 6/2011 | Yun et al. | ................... 430/270.1 |
| 8,097,398 | B2 | * | 1/2012 | Kondoh et al. | ............ 430/273.1 |
| 2005/0175926 | A1 | * | 8/2005 | Sugeta et al. | .............. 430/270.1 |
| 2006/0063104 | A1 | | 3/2006 | Jung et al. | |
| 2011/0200942 | A1 | * | 8/2011 | Masunaga et al. | ......... 430/285.1 |
| 2011/0297563 | A1 | * | 12/2011 | Scarazzini | .................... 206/232 |

FOREIGN PATENT DOCUMENTS

JP 07-295228 11/1995
(Continued)

OTHER PUBLICATIONS

Machine translation of JP 07-311467 (no date).*

(Continued)

*Primary Examiner* — Amanda C. Walke
(74) *Attorney, Agent, or Firm* — Ditthavong Mori & Steiner, P.C.

(57) ABSTRACT

A first film-modifying method includes forming a second film on a first film that includes an acid-dissociable group. The second film is an acid transfer resin film that includes a photoacid generator. The second film is exposed via a mask so that the second film generates an acid. The acid generated by the second film is transferred to the first film. The second film is removed.

12 Claims, 1 Drawing Sheet

| | FOREIGN PATENT DOCUMENTS | |
|---|---|---|
| JP | 07-311467 | 11/1995 |
| JP | 08-305024 | 11/1996 |
| JP | 11-340129 | 12/1999 |
| JP | 2006-072329 | 3/2006 |
| JP | 2006-085149 | 3/2006 |

OTHER PUBLICATIONS

Machine translation of JP 08-305024 (no date).*
International Search Report for International Application No. PCT/JP2009/061886, Jul. 28, 2009.

* cited by examiner

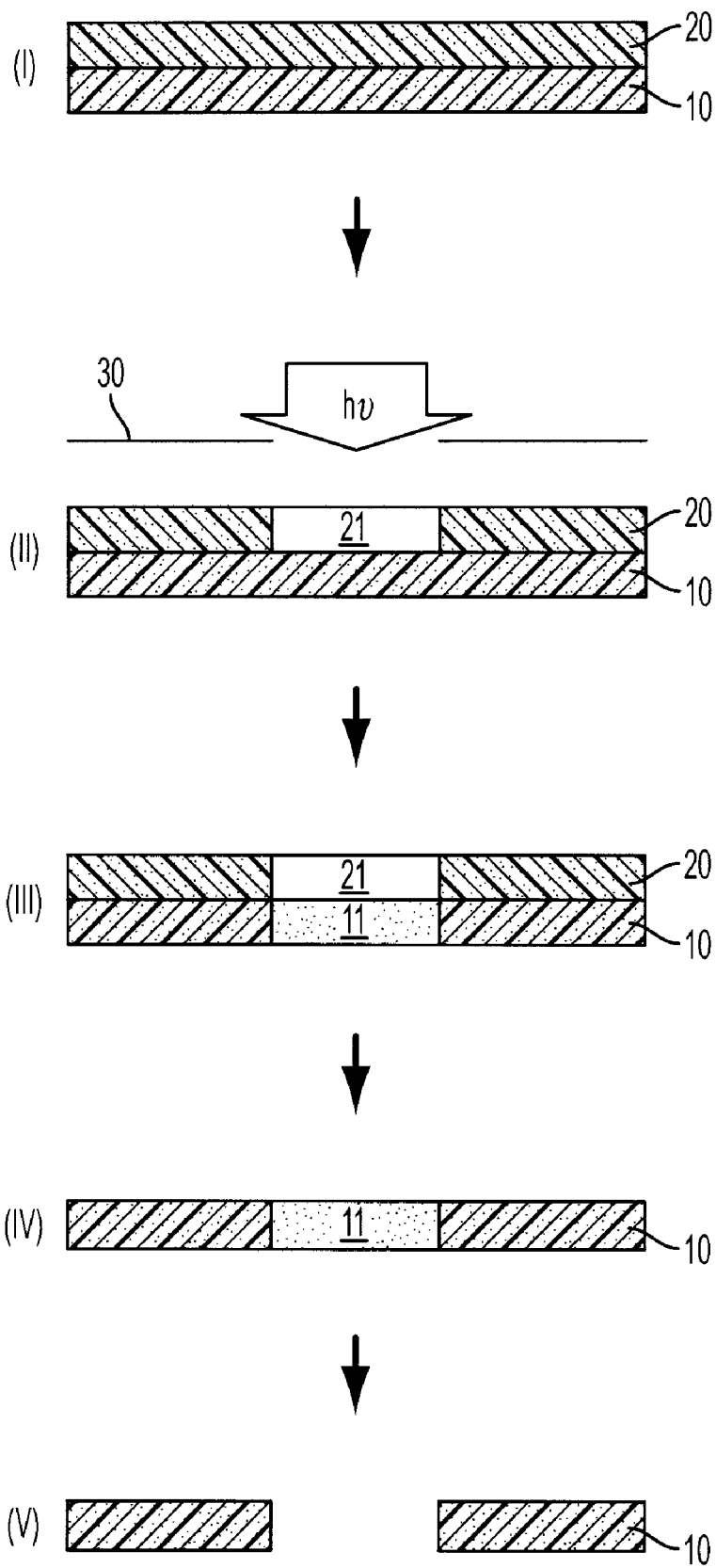

METHOD FOR MODIFYING FIRST FILM AND COMPOSITION FOR FORMING ACID TRANSFER RESIN FILM USED THEREFOR

CROSS-REFERENCE TO RELATED APPLICATIONS

The present application is a continuation application of International Application No. PCT/JP2009/061886, filed Jun. 29, 2009, which claims priority to Japanese Patent Application No. 2008-186554, filed Jul. 17, 2008. The contents of these applications are incorporated herein by reference in their entirety.

BACKGROUND OF THE INVENTION

1. Field of the Invention

The present invention relates to a first film-modifying method and an acid transfer resin film-forming composition used for the first film-modifying method.

2. Discussion of the Background

A pattern-forming method using a radiation-sensitive resin composition that includes an acid-dissociable functional group-containing resin and an acid generator has been known in the field of microfabrication such as production of integrated circuit devices. According to this method, an acid is generated from the acid generator upon exposure, and a specific functional group dissociates from the acid-dissociable functional group-containing resin due to the acid, so that the resin becomes alkali-soluble.

Japanese Patent Application Publication (KOKAI) No. 11-340129 discloses a method that liquefies a resist material using a solvent, and ejects the liquefied resist material to a necessary area from an inkjet head to directly form a pattern. Since this method does not utilize a photolithographic process, the resist material does not include an acid generator.

A radiation-sensitive resin composition exhibits its effects due to an acid generator and an acid-dissociable functional group-containing resin. However, a radiation-sensitive resin composition that does not include an acid generator, or a radiation-sensitive resin composition that does not allow an acid generator or a residue thereof to remain, may be required. In this case, a pattern cannot be formed by a known photolithographic process using an exposure step and a development step. Therefore, a novel pattern-forming method has been desired.

SUMMARY OF THE INVENTION

According to one aspect of the present invention, a first film-modifying method includes forming a second film on a first film that includes an acid-dissociable group. The second film is an acid transfer resin film that includes a photoacid generator. The second film is exposed via a mask so that the second film generates an acid. The acid generated by the second film is transferred to the first film. The second film is removed.

According to another aspect of the present invention, an acid transfer resin film-forming composition is used for a first film-modifying method. The first film-modifying method includes forming a second film on a first film that includes an acid-dissociable group. The second film is an acid transfer resin film that includes a photoacid generator. The second film is exposed via a mask so that the second film generates an acid. The acid generated by the second film is transferred to the first film. The second film is removed. The acid transfer resin film-forming composition is used to form the acid transfer resin film. The acid transfer resin film-forming composition comprises the photoacid generator and a polymer that includes a nitrogen-containing group in its side chain.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a schematic view illustrative of a first film-modifying method (pattern-forming method) according to an embodiment of the present invention.

DESCRIPTION OF THE EMBODIMENTS

The embodiments will now be described with reference to the accompanying drawing, Note that the term "(meth)acryl" used herein refers to acryl and methacryl, and the term "(meth)acrylate" used herein refers to an acrylate and a methacrylate.

[1] First Film-Modifying Method

As shown in FIG. 1, a first film-modifying method according to one embodiment of the invention includes (I) forming a second film 20 on a first film 10 that includes an acid-dissociable group, the second film 20 being an acid transfer resin film that includes a photoacid generator (hereinafter may be referred to as "second film-forming step"), (II) exposing the second film 20 via a mask 30 so that the second film 20 generates an acid (hereinafter may be referred to as "exposure step"), (III) transferring the acid generated by the second film 20 to the first film 10 (hereinafter may be referred to as "acid transfer step"), and (IV) removing the second film 20 (hereinafter may be referred to as "second film-removing step").

[1-1] Second Film (Acid Transfer Resin Film)-Forming Step (I)

In the second film-forming step (I), the acid transfer resin film is formed on the first film. When the first film is a patterning target resin film (described later), and the second film is the acid transfer resin film (described later), the second film-forming step (I) may be referred to as an acid transfer resin film-forming step that forms the acid transfer resin film on the patterning target film.

(1) First Film

The first film includes an acid-dissociable group. The acid-dissociable group may be included in the first film in an arbitrary manner, but is normally included in the first film as part of a polymer (base). Specifically, the first film normally includes an acid-dissociable group-containing polymer (e.g., acid-dissociable group-containing resin). It suffices that the first film include the acid-dissociable group (protecting group). The first film may be a polymer film (acid-dissociable group-containing polymer film), a monomolecular film (acid-dissociable group-containing monomolecular film), a resin film (acid-dissociable group-containing resin film), or the like.

The acid-dissociable group included in the first film dissociates (is removed) due to an acid transferred from the second film as a result of the steps (I) to (VI). Specifically, the acid-dissociable group included in the first film dissociates from the first film (i.e., the first film is modified).

Note that the term "first film" includes an unmodified first film and a modified first film.

Examples of the first film include a patterning target film. The term "patterning target film" refers to a resin film that includes an acid-dissociable group-containing resin, and normally does not include a photoacid generator. The patterning target film is normally insoluble or scarcely soluble in alkali, but becomes alkali-soluble when the acid-dissociable group has dissociated from the acid-dissociable group-containing resin. The term "insoluble or scarcely soluble in alkali" used herein means that a film formed only of the acid-dissociable group-containing resin has a thickness equal to or larger than 50% of the initial thickness when developed under alkali development conditions employed in the examples described later. The term "alkali-soluble" used herein means that a film formed only of the acid-dissociable group-containing resin has a thickness less than 50% of the initial thickness when developed under alkali development conditions employed in the examples described later.

Note that the term "patterning target film (first film)" includes an unpatterned patterning target film and a patterned patterning target film (pattern). Specifically, the patterning target film subjected to the steps (I) to (VI) forms a pattern that includes an area to which an acid has been transferred and an area to which an acid has not been transferred. The area to which an acid has been transferred may be removed by an optional alkaline solution contact step (V), so that a pattern that includes an area to which an acid has not been transferred and an area that has been removed (i.e., an area in which the surface of a substrate is exposed when a substrate is provided under the patterning target film) is obtained. When the alkaline solution is a developer, the alkaline solution contact step (V) may be referred to as "development step (V)".

(1-1) Acid-Dissociable Group-containing Resin

The term "acid-dissociable group" used herein refers to a group (acidic group) that dissociates in the presence of an acid, and substitutes a hydrogen atom included in an acidic group such as a phenolic hydroxyl group, a carboxyl group, a sulfonic acid group, a phosphoric acid group, or an acidic hydroxyl group. Examples of the acid-dissociable group include a t-butoxycarbonyl group, a tetrahydropyranyl group, a tetrahydrofuranyl group, a (thiotetrahydropyranylsulfanyl) methyl group, a (thiotetrahydrofuranylsulfanyl)methyl group, an alkoxy-substituted methyl group, an alkylsulfanyl-substituted methyl group, an acetal group, a hemiacetal group, a group shown by the following formula (3) (hereinafter referred to as "acid-dissociable group (3)"), and the like.

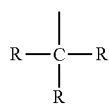

(3)

wherein R individually represent a linear or branched alkyl group having 1 to 14 carbon atoms or a non-bridged or bridged monovalent alicyclic hydrocarbon group having 3 to 20 carbon atoms, provided two of R may bond to form a non-bridged or bridged divalent alicyclic hydrocarbon group having 3 to 20 carbon atoms together with the carbon atom bonded to the two R, and the remaining R may represent a linear or branched alkyl group having 1 to 14 carbon atoms or a non-bridged or bridged monovalent alicyclic hydrocarbon group having 3 to 20 carbon atoms (each of these groups may be substituted or unsubstituted).

Examples of the alkoxy-substituted methyl group include a methoxymethyl group, an ethoxymethyl group, a methoxyethoxymethyl group, an n-propoxymethyl group, an n-butoxymethyl group, an n-pentyloxymethyl group, an n-hexyloxymethyl group, a benzyloxymethyl group, and the like.

Examples of the alkylsulfanyl-substituted methyl group include a methylsulfanylmethyl group, an ethylsulfanylmethyl group, a methoxyethylsulfanylmethyl group, an n-propylsulfanylmethyl group, an n-butylsulfanylmethyl group, an n-pentylsulfanylmethyl group, an n-hexylsulfanylmethyl group, a benzylsulfanylmethyl group, and the like.

Examples of the linear or branched alkyl group having 1 to 14 carbon atoms represented by R in the formula (3) include a methyl group, an ethyl group, an n-propyl group, an i-propyl group, an n-butyl group, a 2-methylpropyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, and the like.

Examples of the substituent for the alkyl group include a hydroxyl group, a carboxyl group, an oxo group (=O), a cyano group, a halogen atom (e.g., fluorine atom or chlorine atom), a linear or branched alkoxy group having 1 to 8 carbon atoms (e.g., methoxy group, ethoxy group, n-propoxy group, i-propoxy group, n-butoxy group, 2-methylpropoxy group, 1-methylpropoxy group, or t-butoxy group), a linear or branched alkoxyalkoxy group having 2 to 8 carbon atoms (e.g., methoxymethoxy group, ethoxymethoxy group, or t-butoxymethoxy group), a linear or branched alkylcarbonyloxy group having 2 to 8 carbon atoms (e.g., methylcarbonyloxy group, ethylcarbonyloxy group, or t-butylcarbonyloxy group), a linear or branched alkoxycarbonyl group having 2 to 8 carbon atoms (e.g., methoxycarbonyl group, ethoxycarbonyl group, or t-butoxycarbonyl group), and the like.

Examples of the non-bridged or bridged monovalent alicyclic hydrocarbon group having 3 to 20 carbon atoms represented by R in the formula (3) include cycloalkyl groups such as a cyclopropyl group, a cyclobutyl group, a cyclopentyl group, a cyclohexyl group, a cycloheptyl group, and a cyclooctyl group, a bicyclo[2.2.1]heptyl group, a bicyclo[2.2.2]octyl group, a tetracyclo[4.2.0.1$^{2.5}$.1$^{7.10}$]dodecyl group, an adamantyl group, and the like.

Examples of a substituent that substitutes the monovalent alicyclic hydrocarbon group represented by R in the formula (3) or the divalent alicyclic hydrocarbon group formed by two of R include a hydroxyl group, a carboxyl group, an oxo group (=O), a cyano group, a halogen atom (e.g., fluorine atom or chlorine atom), a linear or branched alkyl group having 1 to 14 carbon atoms (e.g., methyl group, ethyl group, n-propyl group, i-propyl group, n-butyl group, 2-methylpropyl group, 1-methylpropyl group, or t-butyl group), a linear or branched alkoxy group having 1 to 8 carbon atoms (e.g., methoxy group, ethoxy group, n-propoxy group, i-propoxy group, n-butoxy group, 2-methylpropoxy group, 1-methylpropoxy group, or t-butoxy group), a linear or branched alkoxyalkyl group having 2 to 8 carbon atoms (e.g., methoxymethyl group, ethoxymethyl group, or t-butoxymethyl group), a linear or branched alkoxyalkoxy group having 2 to 8 carbon atoms (e.g., methoxymethoxy group, ethoxymethoxy group, or t-butoxymethoxy group), a linear or branched alkylcarbonyloxy group having 2 to 8 carbon atoms (e.g., methylcarbonyloxy group, ethylcarbonyloxy group, or t-butylcarbonyloxy group), a linear or branched alkoxycarbonyl group having 2 to 8 carbon atoms (e.g., methoxycarbonyl group, ethoxycarbonyl group, or t-butoxycarbonyl group), a linear or branched cyanoalkyl group having 2 to 14 carbon atoms (e.g., cyanomethyl group, 2-cyanoethyl group, 3-cyanopropyl group, or 4-cyanobutyl group), a linear or branched fluoroalkyl group having 1 to 14 carbon atoms (e.g., fluoromethyl group, trifluoromethyl group, or pentafluoroethyl group), and the like.

Specific examples of the acid-dissociable group (3) include a t-butyl group, groups shown by the following formulas (3-1) to (3-20) (wherein m is an integer from 0 to 2), and the like.
(3-1)
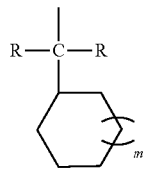
(3-2)
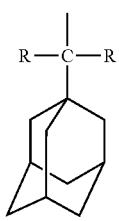
(3-3)
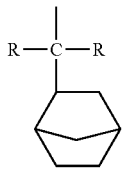
(3-4)
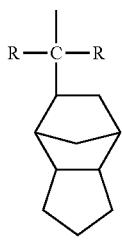
(3-5)
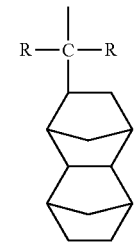
(3-6)
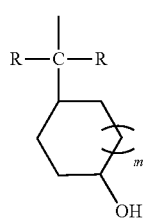
-continued
(3-7)
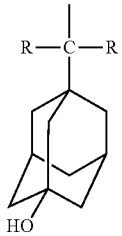
(3-8)
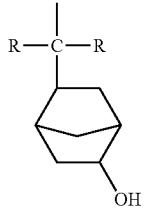
(3-9)
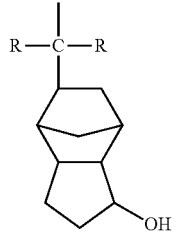
(3-10)
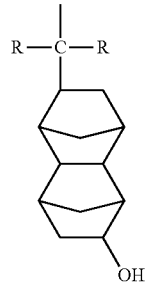
(3-11)
(3-12)
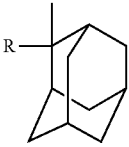
(3-13)
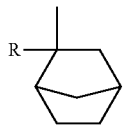

(3-14)
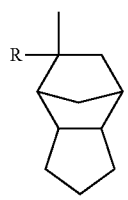

(3-15)
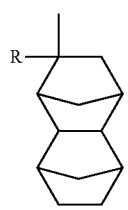

(3-16)
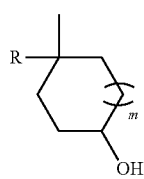

(3-17)
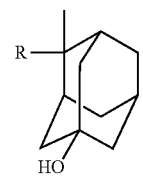

(3-18)
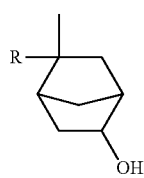

(3-19)
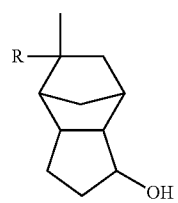

(3-20)
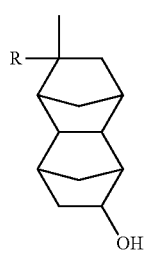

The acid-dissociable group may be included in the acid-dissociable group-containing resin in an arbitrary manner, but is preferably included in the acid-dissociable group-containing resin as part of a structural unit shown by the following formula (4) (hereinafter may be referred to as "acid-dissociable group-containing unit").

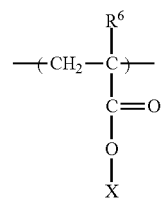
(4)

wherein $R^6$ represents a hydrogen atom or a methyl group, and X represents an acid-dissociable group.

The acid-dissociable group-containing unit may be included in the acid-dissociable group-containing resin in an arbitrary manner. For example, the acid-dissociable group-containing unit may be obtained by polymerizing an acid-dissociable group-containing monomer. Examples of the acid-dissociable group-containing monomer include t-butyl (meth)acrylate, 1,1-dimethylpropyl (meth)acrylate, 1,1-dimethylbutyl (meth)acrylate, 2-cyclohexypropyl (meth)acrylate, 1,1-dimethylphenyl (meth)acrylate, tetrahydropyranyl (meth)acrylate, 2-t-butoxycarbonylmethyl (meth)acrylate, 2-benzyloxycarbonylethyl (meth)acrylate, 2-methyladamantyl (meth)acrylate, 1,1-dimethyl-3-oxobutyl (meth)acrylate, 2-benzylpropyl (meth)acrylate, and the like.

The content of the acid-dissociable group-containing unit included in the acid-dissociable group-containing resin is not particularly limited, but is preferably 5 to 95 mol %, more preferably 10 to 90 mol %, and particularly preferably 15 to 80 mol %, based on the total structural units (=100 mol %) of the acid-dissociable group-containing resin. If the content of the acid-dissociable group-containing unit included in the acid-dissociable group-containing resin is within the above range, a sufficient exposure margin (exposure latitude) can be obtained.

The acid-dissociable group-containing resin normally includes an additional structural unit other than the acid-dissociable group-containing unit. Examples of the additional structural unit include a structural unit that includes an acidic group (e.g., phenolic hydroxyl group). If the acid-dissociable group-containing resin includes a structural unit that includes an acidic group, the solubility of the first film in an alkaline solution (i.e., the solubility of the patterning target film in a developer) can be adjusted. Examples of a monomer that produces a structural unit that includes a phenolic hydroxyl group include phenolic hydroxyl group-containing compounds such as p-isopropenylphenol, m-isopropenylphenol, o-isopropenylphenol, p-hydroxystyrene, m-hydroxystyrene, o-hydroxystyrene, and p-hydroxymethacrylamide. These phenolic hydroxyl group-containing compounds may be used either individually or in combination.

When the acid-dissociable group-containing resin includes a structural unit derived from the phenolic hydroxyl group-containing compound, the content of the structural unit derived from the phenolic hydroxyl group-containing compound is preferably 1 to 50 mol %, more preferably 3 to 45 mol %, and particularly preferably 5 to 40 mol %, based on the total structural units (=100 mol %) of the acid-dissociable group-containing resin. If the content of the structural unit derived from the phenolic hydroxyl group-containing compound included in the acid-dissociable group-containing resin is within the above range, the solubility (alkali solubility) of the first film in a developer can be adjusted when performing the alkaline solution contact step (V). Specifically, the solubility (alkali solubility) of the patterning target film in a developer can be adjusted when performing the developing step (V).

The content of the acid-dissociable group-containing resin included in the patterning target film is not particularly limited, but is preferably 10 to 99.9 mass %, more preferably 30 to 99.9 mass %, and still more preferably 50 to 99.9 mass %, based on the patterning target film (=100 mass %). If the content of the acid-dissociable group-containing resin included in the patterning target film is within the above range, it is possible to provide solubility (alkali solubility) contrast (difference in solubility) in a developer when performing the developing step (V).

When producing the acid-dissociable group-containing resin by polymerizing a polymerizable unsaturated monomer, a branched structure may be introduced into the acid-dissociable group-containing resin using a structural unit derived from a polyfunctional monomer including two or more polymerizable unsaturated bonds and/or an acetal crosslinking group. The heat resistance of the acid-dissociable group-containing resin can be improved by introducing such a branched structure.

The content of the branched structure introduced into the acid-dissociable group-containing resin may be appropriately selected depending on the type of branched structure and the type of resin into which the branched structure is introduced, but is preferably 10 mol % or less based on the total structural units.

The molecular weight of the acid-dissociable group-containing resin is not particularly limited. The polystyrene-reduced weight average molecular weight (Mw) of the acid-dissociable group-containing resin determined by gel permeation chromatography (GPC) is normally 1000 to 500,000, preferably 2000 to 400,000, and more preferably 3000 to 300,000.

The Mw of the acid-dissociable group-containing resin that does not include a branched structure is preferably 1000 to 150,000, and more preferably 3000 to 100,000. The Mw of the acid-dissociable group-containing resin that includes a branched structure is preferably 5000 to 500,000, and particularly preferably 8000 to 300,000.

The ratio (Mw/Mn) of the Mw to the polystyrene-reduced number molecular weight (Mn) of the acid-dissociable group-containing resin determined by GPC is not particularly limited, but is normally 1 to 10, preferably 1 to 8, and more preferably 1 to 5.

The acid-dissociable group-containing resin may be produced by an arbitrary method. For example, the acid-dissociable group-containing resin may be produced by introducing one or more acid-dissociable groups into an acidic group of an alkali-soluble resin produced in advance, or polymerizing one or more polymerizable unsaturated monomers including an acid-dissociable group optionally together with another polymerizable unsaturated monomer, or polycondensing one or more polycondensable components including an acid-dissociable group optionally together with another polycondensable component.

The polymerizable unsaturated monomers used to produce the alkali-soluble resin or one or more polymerizable unsaturated monomers including an acid-dissociable group may be polymerized by bulk polymerization, solution polymerization, precipitation polymerization, emulsion polymerization, suspension polymerization, bulk-suspension polymerization, or the like using an appropriate polymerization initiator or polymerization catalyst (e.g., radical initiator, anionic polymerization catalyst, coordinated anionic polymerization catalyst, or cationic polymerization catalyst) depending on the type of polymerizable unsaturated monomers, the type of reaction medium, and the like.

One or more polycondensable components including an acid-dissociable group are preferably polycondensed in an aqueous medium or a mixture of water and a hydrophilic solvent in the presence of an acidic catalyst.

The patterning target film may be formed by an arbitrary method. The patterning target film is normally formed by applying a liquid patterning target film-forming composition to the surface of a substrate or the like, and drying the applied composition. The liquid patterning target film-forming composition may be produced by mixing the acid-dissociable group-containing resin with a solvent.

A solvent (C) that may be used for an acid transfer resin film-forming composition described later may be used as the solvent. One or more solvents may be used. The solvent included in the patterning target film-forming composition may be the same as or different from the solvent included in the acid transfer resin film-forming composition.

When the patterning target film-forming composition includes a solvent, the content of the solvent is normally 10 to 10,000 parts by mass, preferably 20 to 8000 parts by mass, more preferably 30 to 6000 parts by mass, and still more preferably 40 to 4000 parts by mass, based on 100 parts by mass of the acid-dissociable group-containing resin.

The viscosity of the patterning target film-forming composition may be appropriately adjusted depending on the application method used for the patterning target film-forming composition and the like. For example, the viscosity of the patterning target film-forming composition at 25° C. may be 1 to 100 mPa·s. The viscosity of the patterning target film-forming composition is preferably 2 to 80 mPa·s, and more preferably 3 to 50 mPa·s.

The patterning target film-forming composition may include an additional component other than the solvent. Examples of the additional component include a surfactant. A surfactant (C) that may be used for the acid transfer resin film-forming composition described later may be used as the surfactant. One or more surfactants may be used. The surfactant included in the patterning target film-forming composition may be the same as or different from the surfactant included in the acid transfer resin film-forming composition.

When the patterning target film-forming composition includes a surfactant, the content of the surfactant is normally 0.01 to 1 part by mass, and preferably 0.02 to 0.8 parts by mass, based on 100 parts by mass of the acid-dissociable group-containing resin.

The patterning target film-forming composition may also include a crosslinking agent, a halation inhibitor, a storage stabilizer, a coloring agent, a plasticizer, an anti-foaming agent, and the like.

The patterning target film may be formed on the surface of an arbitrary member, but is normally formed on the surface of a substrate. Examples of the material for the substrate (at least the surface of the substrate) include silicon, a metal (e.g., aluminum), a metal (e.g., aluminum) sputtering film, alumina, glass epoxy, paper phenol, glass, a surface-modified material thereof, and the like. The thickness of the substrate is normally 1000 to 10,000 nm.

The thickness of the patterning target film is not particularly limited, but is normally 1 to 1000 nm, preferably 5 to 500 nm, and more preferably 10 to 100 nm.

The patterning target film-forming composition may be applied by an arbitrary method. For example, rotational coating, cast coating, roll coating, or the like may be used.

After applying the patterning target film-forming composition, the solvent may optionally be vaporized from the resulting film by prebaking (PB). The prebaking temperature is appropriately selected depending on the composition of the patterning target film-forming composition, but is normally about 30 to 150° C., and preferably 50 to 130° C. The prebaking time is normally 30 to 300 seconds, and preferably 60 to 180 seconds.

(2) Second Film (Acid Transfer Resin Film)

The term "second film" refers to a resin film (acid transfer resin film) that includes (A) an photoacid generator.

[2-1] Photoacid Generator (A)

The photoacid generator (A) (hereinafter may be referred to as "acid generator (A)") generates an acid upon exposure. The acid generator (A) generates an acid in the acid transfer resin film (i.e., acid generator-containing resin film) upon exposure. When the acid generated in the second film (i.e., acid transfer resin film) has moved (i.e., has been transferred) to the first film (e.g., patterning target film) in the acid transfer step, the acid-dissociable group dissociates from the first film (the acid-dissociable group dissociates from the acid-dissociable group-containing resin when the first film is the patterning target film), and the area of the first film from which the acid-dissociable group has dissociated (i.e., the acid transfer area of the first film) becomes alkali-soluble. As a result, the acid transfer area of the first film or the entire first film is modified. Specifically, when the first film is the patterning target film, the patterning target film forms a pattern that includes an alkali-soluble area and an alkali insoluble area. The alkali-soluble area can optionally be removed by development using an alkaline developer or the like, so that a pattern that includes only the alkali insoluble area is obtained.

It suffices that the acid generator (A) generate an acid upon exposure. The acid generator (A) may be appropriately selected depending on the type of radiation. The radiation is appropriately selected from ultraviolet rays, deep ultraviolet rays (e.g., KrF excimer laser light, ArF excimer laser light, and $F_2$ excimer laser light), X-rays, electron beams, γ-rays, molecular beams, ion beams, and the like.

Examples of the acid generator (A) include onium salt compounds (including thiophenium salt compounds), halogen-containing compounds, diazoketone compounds, sulfone compounds, sulfonic acid compounds, sulfonimide compounds, diazomethane compounds, and the like. These compounds may be used as the acid generator (A) either individually or in combination.

Examples of the onium salt compounds include thiophenium salt compounds, iodonium salt compounds, sulfonium salt compounds, phosphonium salt compounds, diazonium salt compounds, pyridinium salt compounds, and the like.

Examples of the thiophenium salt compounds include 4,7-di-n-butoxynaphthyltetrahydrothiophenium salt compounds such as 4,7-di-n-butoxynaphthyltetrahydrothiophenium trifluoromethanesulfonate; 1-(4-n-butoxynaphthalen-1-yl)tetrahydrothiophenium salt compounds such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium-2-bicyclo[2.2.1]hept-2-yl-1,1,2,2-tetrafluoroethanesulfonate, and 1-(4-n-butoxynaphthalen-1-yl)tetrahydrothiophenium camphorsulfonate; 1-(6-n-butoxynaphthalen-2-yl)tetrahydrothiophenium salt compounds such as 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, and 1-(6-n-butoxynaphthalen-2-yl)tetrahydrothiophenium camphorsulfonate; 1-(3,5-dimethyl-4-hydroxyphenyl)tetrahydrothiophenium salt compounds such as 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and 1-(3,5-dimethyl-4-hydroxyphenyl)tetrahydrothiophenium camphorsulfonate; and the like.

Examples of the iodonium salt compounds include bis(4-t-butylphenyl)iodonium salt compounds such as bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and bis(4-t-butylphenyl)iodonium camphorsulfonate; diphenyliodonium salt compounds such as diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, diphenyliodonium p-toluenesulfonate, diphenyliodonium hexafluoroantimonate, diphenyliodonium hexafluorophosphate, and diphenyliodonium tetrafluoroborate; and the like.

Examples of the sulfonium salt compounds include triphenylsulfonium salt compounds such as triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, and triphenylsulfonium hexafluorophosphate; 4-t-butylphenyldiphenylsulfonium salt compounds such as 4-t-butylphenyldiphenylsulfonium trifluoromethanesulfonate, 4-t-butylphenyldiphenylsulfonium perfluoro-n-octanesulfonate, 4-t-butylphenyldiphenylsulfonium pyrenesulfonate, 4-t-butylphenyldiphenylsulfonium n-dodecylbenzenesulfonate, 4-t-butylphenyldiphenylsulfonium p-toluenesulfonate, and 4-t-butylphenyldiphenylsulfonium benzenesulfonate; 4-cyclohexylphenyldiphenylsulfonium salt compounds such as 4-cyclohexylphenyldiphenylsulfonium trifluoromethane sulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, and 4-cyclohexylphenyldiphenylsulfonium camphorsulfonate; 4-methanesulfonylphenyldiphenylsulfonium salt compounds such as 4-methanesulfonylphenyldiphenylsulfonium trifluoromethane sulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, and 4-methanesulfonylphenyldiphenylsulfonium camphorsulfonate; and the like.

Examples of the halogen-containing compounds include haloalkyl group-containing hydrocarbon compounds, haloalkyl group-containing heterocyclic compounds, and the like. Specific examples of the halogen-containing compounds include 1,10-dibromo-n-decane, 1,1-bis(4-chlorophenyl)-2,2,2-trichloroethane, (trichloromethyl)-s-triazine derivatives such as phenyl-bis(trichloromethyl)-s-triazine, 4-methoxyphenyl-bis(trichloromethyl)-s-triazine, styryl-bis(trichloromethyl)-s-triazine, and naphthyl-bis(trichloromethyl)-s-triazine, and the like.

Examples of the diazoketone compounds include 1,3-diketo-2-diazo compounds, diazobenzoquinone compounds, diazonaphthoquinone compounds, and the like. Specific examples of the diazoketone compounds include 1,2-naphthoquinonediazido-4-sulfonate of phenols, 1,2-naphthoquinonediazido-5-sulfonate of phenols, and the like.

Examples of the sulfone compounds include β-ketosulfone, β-sulfonylsulfone, α-diazo compounds thereof, and the like. Specific examples of the sulfone compounds include 4-trisphenacylsulfone, mesitylphenacylsulfone, bis(phenylsulfonyl)methane, and the like.

Examples of the sulfonic acid compounds include alkyl sulfonates, haloalkyl sulfonates, aryl sulfonates, iminosulfonates, and the like. Specific examples of the sulfonic acid compounds include benzointocylate, pyrogallol tristrifluoromethanesulfonate, o-nitrobenzyl-trifluoromethanesulfonate, o-nitrobenzyl-p-toluenesulfonate, and the like.

Examples of the sulfonimide compounds include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-7-oxabicyclo[2.2.1]hept-5-ene-2,3-dicarboximide, N-(trifluoromethylsulfonyloxy)-5,6-oxy-bicyclo[2.2.1]heptane-2,3-dicarboxylmide, N-(trifluoromethylsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboxylmide, N-(4-methylphenylsulfonyloxy)-7-oxabicyclo[2.2.1]hept-5-ene-2,3-dicarboxylmide, N-(4-methylphenylsulfonyloxy)-5,6-oxy-bicyclo[2.2.1]heptane-2,3-dicarboxylmide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboxylmide, N-(2-trifluoromethylphenylsulfonyloxy)-7-oxabicyclo[2.2.1]hept-5-ene-2,3-dicarboxylmide, N-(2-trifluoromethylphenylsulfonyloxy)-5,6-oxybicyclo[2.2.1]heptane-2,3-dicarboxylmide, N-(2-trifluoromethylphenylsulfonyloxy)naphthylimide, N-(4-fluorophenylsulfonyloxy)succinimide, N-(4-fluorophenylsulfonyloxy)-7-oxabicyclo[2.1.1]hepto-5-ene-2,3-dicarboxylmide, N-(4-fluorophenylsulfonyloxy)-5,6-oxybicyclo[2.2.1]heptane-2,3-dicarboxylmide, N-(4-fluorophenylsulfonyloxy)naphthylimide, N-(10-camphorsulfonyloxy)naphthylimide, and the like.

Examples of the diazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl-p-toluenesulfonyldiazomethane, cyclohexylsulfonyl-1,1-dimethylethylsulfonyldiazomethane, bis(1,1-dimethylethylsulfonyl)diazomethane, and the like.

The acid generator (A) is preferably an onium salt compound, more preferably a thiophenium salt compound, still more preferably a 4,7-di-n-butoxynaphthyltetrahydrothiophenium salt compound, and particularly preferably 4,7-di-n-butoxynaphthyltetrahydrothiophenium trifluoromethanesulfonate.

The second film normally includes (B) a polymer in addition to the photoacid generator (A). The content of the acid generator is not particularly limited, but is preferably 0.1 to 200 parts by mass, more preferably 10 to 150 parts by mass, and particularly preferably 20 to 200 parts by mass, based on 100 parts by mass of the polymer (B), from the viewpoint of ensuring that the second film exhibits a transfer capability. If the content of the acid generator (A) is within the above range, a resin film that exhibits an excellent acid transfer capability can be obtained.

[2-1] Polymer (B)

The second film (acid transfer resin film) normally includes the polymer (B) in addition to the photoacid generator (A). The type of the polymer (B) is not particularly limited. The polymer (B) may be an acrylic polymer, an epoxy polymer, or a silicone polymer. Among these, an acrylic polymer is preferable from the viewpoint of the resolution of the resulting pattern.

It is preferable that the polymer (B) include a nitrogen-containing group in its side chain. If the second film (acid transfer resin film) includes a polymer that includes a nitrogen-containing group, undesirable acid diffusion in the second film (acid transfer resin film) can be prevented when the acid generator (A) has generated an acid (i.e., the polymer functions as an acid diffusion-preventing resin). Therefore, unintended acid transfer (acid diffusion) to another layer (particularly the first film) can be prevented (i.e., sensitivity is improved), so that the resolution of the resulting pattern can be improved.

Note that the term "nitrogen-containing group" refers to a substituent that includes a nitrogen atom. Examples of the nitrogen-containing group include a group having a structure shown by $-NR^1R^2$ (hereinafter referred to as "amine group"), an azido group, an imido group, a urea group, a urethane group, a pyridine group, and the like.

Among these, an amine group is preferable. $R^1$ and $R^2$ in the amine group individually represent a hydrogen atom, a linear or branched hydrocarbon group having 1 to 10 carbon atoms, or a cyclic hydrocarbon group having 3 to 10 carbon atoms. $R^1$ and $R^2$ may bond to form a 3 to 10-membered monocyclic hetero ring, or may bond via at least one hetero atom selected from a nitrogen atom, an oxygen atom, a sulfur atom, and a selenium atom to form a 4 to 10-membered monocyclic hetero ring.

Examples of the linear or branched hydrocarbon group having 1 to 10 carbon atoms represented by $R^1$ and $R^2$ in the amine group include aliphatic hydrocarbon groups such as a methyl group, an ethyl group, an n-propyl group, an i-propyl group, an n-butyl group, a 2-methylpropyl group, a 1-methylpropyl group, a t-butyl group, and the like.

Examples of the cyclic hydrocarbon group having 3 to 10 carbon atoms represented by $R^1$ and $R^2$ in the amine group include alicyclic groups such as a cyclobutyl group, a cyclopentyl group, a cyclohexyl group, a cycloheptyl group, and a cyclooctyl group, and aromatic groups such as a phenyl group, an o-tolyl group, an m-tolyl group, a p-tolyl group, a 4-t-butylphenyl group, a 1-naphthyl group, and a benzyl group.

When and $R^1$ and $R^2$ in the amine group bond to form a 3 to 10-membered monocyclic hetero ring (the monocyclic hetero ring may be an unsaturated ring or a saturated ring), the amine group may be an aziridino group, an azetino group, a pyrrolidino group, a pyrrole group, a piperidino group, a pyrridino group, or the like.

When $R^1$ and $R^2$ in the amine group bond via at least one hetero atom selected from a nitrogen atom, an oxygen atom, a sulfur atom, and a selenium atom to form a 4 to 10-membered monocyclic hetero ring (the monocyclic hetero ring may be an unsaturated ring or a saturated ring), the amine group may be a morpholino group, a thiomorpholino group, a selenomorpholino group, an iso-oxazolidino group, an isoxazole group, an isothiazolidino group, an isothiazole group, an imidazolidino group, a piperazino group, a triazino group, or the like.

The amine group may be included in the side chain of the polymer (B) in an arbitrary manner, but is preferably included in the polymer (B) as a structural unit shown by the following formula (1). Specifically, the polymer (B) is preferably a polymer (B') that includes a structural unit shown by the formula (1).

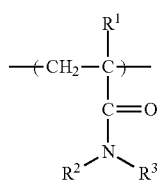
(1)

wherein $R^1$ represents a hydrogen atom or a methyl group, and $R^2$ and $R^3$ individually represent a hydrogen atom, a linear or branched hydrocarbon group having 1 to 10 carbon atoms, or a cyclic hydrocarbon group having 3 to 10 carbon atoms, provided that $R^2$ and $R^3$ may bond to form a 3 to 10-membered monocyclic hetero ring that includes a nitrogen atom, an oxygen atom, a sulfur atom, or a selenium atom.

If the polymer (B) includes the structural unit shown by the formula (1), undesirable acid diffusion in the second film (acid transfer resin film) can be prevented when the acid generator has generated an acid (i.e., the polymer functions as an acid diffusion-preventing resin). Therefore, unintended acid transfer (acid diffusion) to the patterning target film can be prevented, so that the resolution of the resulting pattern can be improved.

The structural unit shown by the formula (1) may be included in the polymer (B) in an arbitrary manner. For example, the structural unit shown by the formula (1) may be obtained by polymerizing a monomer (Bm1) shown by the following formula (5).

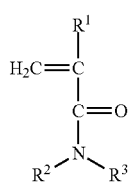
(5)

wherein R represents a hydrogen atom or a methyl group, and $R^2$ and $R^3$ individually represent a hydrogen atom, a linear or branched hydrocarbon group having 1 to 10 carbon atoms, or a cyclic hydrocarbon group having 3 to 10 carbon atoms, provided that $R^2$ and $R^3$ may bond to form a 3 to 10-membered monocyclic hetero ring that includes a nitrogen atom, an oxygen atom, a sulfur atom, or a selenium atom.

Examples of the linear or branched hydrocarbon group having 1 to 10 carbon atoms represented by $R^2$ and/or $R^3$ in the formula (5) include aliphatic hydrocarbon groups such as a methyl group, an ethyl group, an n-propyl group, an i-propyl group, an n-butyl group, a 2-methylpropyl group, a 1-methylpropyl group, and a t-butyl group.

Examples of the monomer (Bm1) in which $R^2$ and/or $R^3$ in the formula (5) represents a linear or branched hydrocarbon group having 1 to 10 carbon atoms include N,N-dimethyl(meth)acrylamide, N,N-diethyl(meth)acrylamide, N-isopropyl(meth)acrylamide, and the like.

Examples of the cyclic hydrocarbon group having 3 to 10 carbon atoms represented by $R^2$ and/or $R^3$ in the formula (5) include alicyclic hydrocarbon groups such as a cyclobutyl group, a cyclopentyl group, a cyclohexyl group, a cycloheptyl group, and a cyclooctyl group, and aromatic groups such as a phenyl group, an o-tolyl group, an m-tolyl group, a p-tolyl group, a 4-t-butylphenyl group, a 1-naphthyl group, and a benzyl group.

Examples of the monomer (Bm1) in which $R^2$ and $R^3$ in the formula (5) bond to form a 3 to 10-membered monocyclic hetero ring that includes a nitrogen atom, an oxygen atom, a sulfur atom, or a selenium atom include N-(meth)acryloylmorpholine and the like.

The expression "$R^2$ and $R^3$ bond to form a 3 to 10-membered monocyclic hetero ring that includes a nitrogen atom, an oxygen atom, a sulfur atom, or a selenium atom" means that $R^2$ and $R^3$ bond to form a 3 to 10-membered monocyclic hetero ring, or bond via at least one hetero atom selected from a nitrogen atom, an oxygen atom, a sulfur atom, and a selenium atom to form a 4 to 10-membered monocyclic hetero ring.

As the monomer (Bm1), N,N-dimethylacrylamide, N,N-dimethyl(meth)acrylamide, N-acryloylmorpholine, and N-methacryloylmorpholine are preferable. A polymer (B) obtained using these preferable monomers exhibits a particularly excellent diffusion preventing effect.

The content of the structural unit shown by the formula (1) included in the polymer (B) is not particularly limited, but is preferably 1 to 50 mol %, more preferably 3 to 40 mol %, and particularly preferably 5 to 30 mol %, based on the total structural units (=100 mol %) of the polymer (B). If the content of the structural unit shown by the formula (1) included in the polymer (B) is within the above range, the above diffusion preventing effect can be advantageously obtained.

The polymer (B) may include an additional structural unit other than the structural unit shown by the formula (1). The additional structural unit is preferably a structural unit shown by the following formula (2).

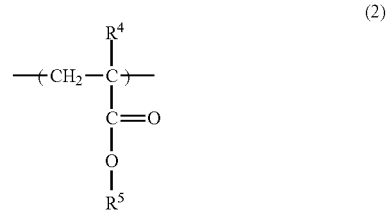
(2)

wherein $R^4$ represents a hydrogen atom or a methyl group, and $R^5$ represents a monovalent organic group.

The structural unit shown by the formula (2) may be included in the polymer (B) in an arbitrary manner. For example, the polymer (B) that includes the structural unit shown by the formula (2) may be obtained using a monomer (Bm2) shown by the following formula (6).

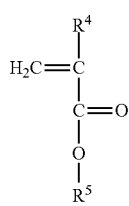

(6)

wherein $R^4$ represents a hydrogen atom or a methyl group, and $R^5$ represents a monovalent organic group.

Examples of the monovalent organic group represented by $R^5$ include linear or branched alkyl groups having 1 to 12 carbon atoms such as a methyl group, an ethyl group, an n-propyl group, an i-propyl group, an n-butyl group, a 2-methylpropyl group, a 1-methylpropyl group, and a t-butyl group; aromatic hydrocarbon groups (particularly aromatic hydrocarbon groups having 6 to 20 carbon atoms) such as a phenyl group, an o-tolyl group, an m-tolyl group, a p-tolyl group, a 2,4-xylyl group, a 2,6-xylyl group, a 3,5-xylyl group, a mesityl group, an o-cumenyl group, an m-cumenyl group, a p-cumenyl group, a benzyl group, a phenethyl group, a 1-naphthyl group, and a 2-naphthyl group; hydroxyalkyl groups (particularly hydroxyalkyl groups having 1 to 8 carbon atoms) such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group, a 4-hydroxybutyl group, a 3-hydroxycyclopentyl group, and a 4-hydroxycyclohexyl group; nitrogen-containing organic groups (particularly nitrogen-containing organic groups having 2 to 9 carbon atoms) such as a cyano group, and cyanoalkyl groups such as a cyanomethyl group, a 1-cyanoethyl group, a 2-cyanoethyl group, a 1-cyanopropyl group, a 2-cyanopropyl group, a 3-cyanopropyl group, a 1-cyanobutyl group, a 2-cyanobutyl group, a 3-cyanobutyl group, a 4-cyanobutyl group, a 3-cyanocyclopentyl group, and a 4-cyanocyclohexyl group; and alicyclic hydrocarbon groups such as cyclic hydrocarbon groups such as a cyclopentyl group and a cyclohexyl group, and bridged cyclic hydrocarbon groups such as a bornyl group and an isobornyl group.

$R^5$ may be the acid-dissociable group (X) in the formula (4), but is preferably not an acid-dissociable group.

The monomer (Bm2) is preferably a (meth)acrylate compound. Examples of the monomer (Bm2) include methyl (meth)acrylate, ethyl (meth)acrylate, n-propyl (meth)acrylate, n-butyl (meth)acrylate, 2-hydroxyethyl (meth)acrylate, 2-hydroxypropyl (meth)acrylate, polyethylene glycol mono (meth)acrylate, polypropylene glycol mono(meth)acrylate, glycerol mono(meth)acrylate, phenyl (meth)acrylate, benzyl (meth)acrylate, cyclohexyl (meth)acrylate, isobornyl (meth) acrylate, tricyclodecanyl (meth)acrylate, and the like. These (meth)acrylate compounds may be used either individually or in combination.

Methyl methacrylate is particularly preferable as the (meth)acrylate compound.

The content of the structural unit shown by the formula (2) included in the polymer (B) is not particularly limited, but is preferably 5 to 99 mol %, more preferably 10 to 97 mol %, and particularly preferably 15 to 95 mol %, based on the total structural units (=100 mol %) of the polymer (B). If the content of the structural unit shown by the formula (2) included in the polymer (B) is within the above range, the above diffusion preventing effect can be advantageously obtained.

The second film (acid transfer resin film) may be formed by an arbitrary method. The second film is normally formed by applying a liquid acid transfer resin film-forming composition to the surface of the patterning target film, and drying the applied composition. The liquid acid transfer resin film-forming composition may be produced by mixing the acid generator (A) and the polymer (B) with (C) a solvent.

The type of the solvent (C) is not particularly limited. For example, water and/or an organic solvent may be used as the solvent (C). One or more solvents may be used.

Examples of the organic solvent include alkyl ethers such as propylene glycol monomethyl ether, propylene glycol monoethyl ether, ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, dipropyl ether, diisopropyl ether, butyl methyl ether, butyl ethyl ether, butyl propyl ether, dibutyl ether, diisobutyl ether, tert-butyl-methyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl 2-propyl ether, cyclohexyl propyl ether, cyclohexyl 2-propyl ether, cyclopentyl butyl ether, cyclopentyl tert-butyl ether, cyclohexyl butyl ether, and cyclohexyl tert-butyl ether; alkyl alcohols such as 1-propanol, n-butanol, 2-butanol, 1-pentanol, 2-pentanol, 3-pentanol, 2-methyl-1-propanol, neopentyl alcohol, tert-amyl alcohol, isoamyl alcohol, 3-methyl-2-butanol, 2-methyl-1-butanol, 2-ethyl-1-butanol, 2-methyl-1-pentanol, and 4-methyl-2-pentanol; hydrocarbons such as decane, dodecane, undecane, benzene, toluene, and xylene; and the like.

The content of the solvent (C) in the acid transfer resin film-forming composition is normally 10 to 10,000 parts by mass, preferably 20 to 8000 parts by mass, more preferably 30 to 6000 parts by mass, and still more preferably 40 to 4000 parts by mass, based on 100 parts by mass of the polymer (B).

The viscosity of the acid transfer resin film-forming composition may be appropriately adjusted depending on the application method used for the acid transfer resin film-forming composition and the like. For example, the viscosity of the acid transfer resin film-forming composition at 25° C. may be 1 to 100 mPa·s. The viscosity of the acid transfer resin film-forming composition is preferably 2 to 80 mPa·s, and more preferably 3 to 50 mPa·s.

The acid transfer resin film-forming composition may include an additional component other than the solvent (C). The additional component may be (D) a surfactant. Examples of the surfactant (D) include a nonionic surfactant, an anionic surfactant, a cationic surfactant, an amphoteric surfactant, a silicone surfactant, a polyalkylene oxide surfactant, a fluorine-containing surfactant, and the like.

Specific examples of the surfactant (D) include polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, polyethylene glycol distearate, and commercially available products such as NBX-7, NBX-8, NBX-15 (manufactured by Neos Co., Ltd.), SH8400 FLUID (manufactured by Toray Dow Corning Silicone Co., Ltd.), KP341 (manufactured by Shin-Etsu Chemical Co., Ltd.), Polyflow No. 75, Polyflow No. 95 (manufactured by Kyoeisha Chemical Co., Ltd.), FFTOP EF301, FTOP EF303, FTOP EF352 (manufactured by JEMCO, Inc.), Megafac F171, Megafac F172, Megafac F173, Megafac F471, Megafac R07, Megafac R08, (manufactured by DIC Corporation), Fluorad FC430, Fluorad FC431, (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either individually or in combination.

The surfactant (D) is normally used in an amount of 0.01 to 0.5 parts by mass, and preferably 0.02 to 0.1 parts by mass, based on 100 parts by mass of the polymer (B).

The acid transfer resin film-forming composition may also include a crosslinking agent, a halation inhibitor, a storage stabilizer, a coloring agent, a plasticizer, an anti-foaming agent, and the like.

The acid transfer resin film-forming composition may be applied by an arbitrary method. For example, rotational coating, cast coating, roll coating, or the like may be used.

After applying the acid transfer resin film-forming composition, the solvent may be volatilized from the resulting film by prebaking (PB) to form a second film. The prebaking temperature is appropriately selected depending on the composition of the acid transfer resin film-forming composition, but is normally about 30 to 150° C., and preferably 50 to 130° C. The prebaking time is normally 30 to 300 seconds, and preferably 60 to 180 seconds.

The thickness of the second film formed on the first film (e.g., patterning target film) is not particularly limited, but is normally 1 to 10,000 nm, preferably 5 to 800 nm, and more preferably 10 to 500 nm.

[1-2] Exposure Step (II)

In the exposure step (II), the second film is exposed via a mask so that the second film generates an acid. As shown in FIG. 1, the exposed area of the second film 20 thus forms an acid-generating area 21.

The type of radiation used for exposure is not particularly limited. Radiation used for exposure is appropriately selected from LED light, ultraviolet rays (including g-line and i-line), deep ultraviolet rays (including KrF excimer laser light, ArF excimer laser light, and $F_2$ excimer laser light), X-rays, electron beams, γ-rays, molecular beams, ion beams, and the like depending on the type of acid generator included in the second film. The dose and the like are also appropriately selected depending on the type of acid generator included in the second film.

[1-3] Acid Transfer Step (III)

In the acid transfer step (III), the acid generated by the second film is transferred to the first film. As shown in FIG. 1, the area of the first film 10 corresponding to the acid-generating area 21 thus forms an acid transfer area 11.

The acid may be transferred by an arbitrary method. For example, the acid may be transferred by (1) heating the film, (2) allowing the film to stand at room temperature, or (3) utilizing an osmotic pressure. These methods may be used either individually or in combination. Note that it is preferable to transfer the acid by heating the film ((1)) due to excellent transfer efficiency.

In this case, the heating temperature is not particularly limited, but is preferably 31 to 200° C., and more preferably 70 to 150° C. The heating time is preferably 30 to 300 seconds, and more preferably 60 to 180 seconds.

When transferring the acid by heating the film, the film may be heated two or more times so that the same result as that under the above heating conditions is obtained.

Note that the method (2) (i.e., allowing the film to stand at room temperature) refers to a method in which the acid generated by the second film is allowed to diffuse into the first film spontaneously by allowing the film to stand at room temperature (normally 20 to 30° C.).

[1-4] Second Film-Removing Step (IV)

In the second film-removing step (IV), the second film is removed. Specifically, the first film (e.g., patterning target film) under the second film to which the acid has been transferred is exposed by removing the second film.

The second film may be removed by an arbitrary method. The second film is normally removed by dissolving the second film in an organic solvent. The organic solvent used in the second film-removing step (IV) dissolves the second film, but does not dissolve the first film to which the acid has been transferred.

The organic solvent is preferably selected depending on the resin composition of the first film and the second film. The organic solvent is not particularly limited insofar as the organic solvent does not dissolve the first film, but dissolves the second film. Specific examples of the organic solvent include acetonitrile, acetone, tetrahydrofuran, pyridine, and the like. These organic solvents may be used either individually or in combination.

In the modifying method (particularly the pattern-forming method) according to one embodiment of the invention, a pattern that includes an area to which an acid has been transferred and an area to which an acid is not transferred is obtained by sequentially performing the above steps (second film-forming step (I) to the second film-removing step (IV)). The alkaline solution contact step (particularly the development step) (V) may optionally be performed after the above steps. In the alkaline solution contact step (V), the area (11 in FIG. 1) to which the acid has been transferred by the above steps is removed from the first film (10 in FIG. 1) to obtain a pattern (12 in FIG. 1) that includes the remaining area of the first film and the area from which the first film has been removed.

[1-5] Alkaline Solution Contact Step (V)

In the alkaline solution contact step (V), the first film is caused to come in contact with an alkaline solution (e.g., the first film is developed using an alkaline developer) after the second film-removing step. Specifically, a pattern 12 is obtained by removing the acid transfer area 11 formed in the first film 10 (see FIG. 1).

Examples of the alkaline solution (particularly the alkaline developer) include a solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in a solvent.

The concentration of the alkaline compound in the alkaline solution is not particularly limited, but is preferably 0.1 to 5 mass %, and more preferably 0.3 to 3 mass %.

The solvent used to prepare the alkaline solution is not particularly limited. For example, water and/or an organic solvent may be used. Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methyl alcohol, ethyl alcohol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide, and the like. These organic solvents may be used either individually or in combination.

An appropriate amount of surfactant or the like may be added to the alkaline solution.

In the modifying method according to one embodiment of the invention, a patterned first film is obtained by sequentially performing the above steps (second film-forming step (I) to alkaline solution contact step (V)). In the modifying method according to one embodiment of the invention, the above steps (second film-forming step (I) to alkaline solution contact step (V)) may be repeated.

The modifying method may include an additional step other than the alkaline solution contact step (V). Examples of the additional step include a washing step that washes the modified first film (e.g., patterning target film (the area of the patterning target film that remains after removing the acid transfer area) with water after the alkaline solution contact step, and the like.

[2] Acid Transfer Resin Film-Forming Composition

The acid transfer resin film-forming composition has a configuration described in connection with the section entitled "[1] First film-modifying method".

Specifically, an acid transfer resin film-forming composition according to one embodiment of the invention is used for a first film-modifying method including (I) forming a second film on a first film that includes an acid-dissociable group, the second film being an acid transfer resin film that includes a photoacid generator, (II) exposing the second film via a mask so that the second film generates an acid, (III) transferring the acid generated by the second film to the first film, and (IV) removing the second film, the acid transfer resin film-forming composition being used to form the acid transfer resin film, and including (A) the photoacid generator, and (B) a polymer that includes a nitrogen-containing group in its side chain.

The polymer (B) may include the structural unit shown by the formula (1). The polymer (B) may also include the structural unit shown by the formula (2). The content of the photoacid generator (A) may be 20 to 100 parts by mass based on 100 parts by mass of the polymer (B).

EXAMPLES

The embodiment of the invention is further described below by way of examples. Note that the embodiment of the invention is not limited to the following examples. In the following examples, the units "parts" and "%" respectively refer to "parts by mass" and "mass %" unless otherwise indicated.

[1] Production of Patterning Target Film-Forming Composition 20 g of t-butyl acrylate, 30 g of p-isopropenylphenol, 20 g of p-hydroxyphenylmethacrylamide, 20 g of hydroxyethyl acrylate, 10 g of phenoxypolyethylene glycol acrylate, and 120 g of propylene glycol monomethyl ether acetate (solvent) were mixed, and stirred to prepare a homogeneous solution. Nitrogen gas was bubbled into the resulting solution for 30 minutes. After the addition of 4 g of 2,2'-azobisisobutyronitrile (AIBN) (initiator), the mixture was polymerized at 70° C. for 3 hours while bubbling nitrogen gas into the mixture. After the addition of 1 g of AIBN, the mixture was reacted for 3 hours, and then reacted at 100° C. for 1 hour to complete polymerization. The resulting reaction solution was mixed with a large quantity of hexane to coagulate the product contained in the reaction solution. After dissolving the coagulate in tetrahydrofuran, the product was again coagulated using hexane. This operation was repeated several times to remove unreacted monomers. The polymer was dried at 50° C. under reduced pressure to obtain an acid-dissociable group-containing resin.

The yield of the acid-dissociable group-containing resin was 95%. The acid-dissociable group-containing resin had an Mw of 15,000, and an Mw/Mn ratio of 2.5.

100 parts by mass of the acid-dissociable group-containing resin, 0.05 parts by mass of "NBX-15" (manufactured by Neos Co., Ltd.) (surfactant), and 2000 parts by mass of propylene glycol monomethyl ether acetate (solvent) were mixed, and stirred to obtain a homogeneous solution. The solution was filtered through a capsule filter (pore size: 0.5 μm) to obtain a patterning target film-forming composition.

The following measurement and evaluation methods were used in each synthesis example.

(1) Mw and Mn

The Mw and the Mn were determined by gel permeation chromatography (GPC) (flow rate: 1.0 ml/min, eluant: tetrahydrofuran, column temperature: 40° C., standard: monodisperse polystyrene) using GPC columns manufactured by Tosoh Corp. (G2000HXL×2, G3000×1, G4000HXL×1). The dispersibility (Mw/Mn) was calculated from the measurement results.

(2) $^{13}$C-NMR Analysis

Each polymer was subjected to $^{13}$C-NMR analysis (solvent: $CDCL_3$) using an instrument "JNM-EX270" (manufactured by JEOL Ltd.).

[2] Production of acid transfer resin film-forming composition (Experimental Examples 1 to 8)

(1) Synthesis of Polymer (B)

Synthesis Example 1 (Synthesis of polymer B1)

In Synthesis Example 1, N,N-dimethylacrylamide shown by the following formula (7) was used as the monomer (Bm1) for introducing the structural unit shown by the formula (1), and methyl methacrylate was used as the monomer (Bm2) for introducing the structural unit shown by the formula (2).

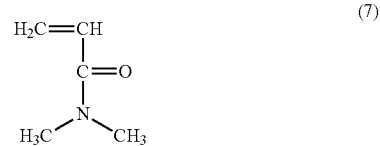

(7)

A 500 ml beaker was charged with 5 g of N,N-dimethylacrylamide (monomer Bm1, manufactured by Kojin Co., Ltd.), 95 g of methyl methacrylate (monomer Bm2, manufactured by Mitsubishi Materials Corp.), and 3.0 g of 2,2'-azobisisobutyronitrile (initiator). The mixture was stirred until the initiator was dissolved to obtain a homogeneous solution. A flask equipped with a dry ice/methanol reflux condenser in which the atmosphere was replaced with nitrogen was charged with 150 g of propylene glycol monomethyl ether acetate (solvent). The propylene glycol monomethyl ether acetate was heated to 80° C. with gentle stirring. The above solution was then slowly added dropwise to the flask over 2 hours. After the addition, the monomers were polymerized at 80° C. for 3 hours. After increasing the temperature of the mixture to 100° C., the mixture was stirred for 1 hour to complete polymerization. The reaction solution was added dropwise to a large quantity of cyclohexane to coagulate the product. The coagulated product was washed with water, and dissolved in an equal mass of tetrahydrofuran. The solution was added dropwise to a large quantity of cyclohexane to coagulate the product. This dissolution-coagulation cycle was performed three times in total. The resulting coagulated product was dried at 40° C. for 48 hours under vacuum to obtain a polymer B1.

The yield of the polymer B1 was 90%. The polymer B1 had an Mw of 11,000, and an Mw/Mn ratio of 2.3. The polymer B1 is a resin including the structural unit shown by the formula (1).

Synthesis Example 2 (Synthesis of polymer B2)

A polymer B2 was obtained in the same manner as in Synthesis Example 1, except for using 10 g of N,N-dimethylacrylamide (monomer Bm1, manufactured by Kojin Co., Ltd.) and 90 g of methyl methacrylate (monomer Bm2, manufactured by Mitsubishi Materials Corp.).

The polymer B2 had an Mw of 10,000. The polymer B2 is a resin including the structural unit shown by the formula (1).

Synthesis Example 3 (Synthesis of polymer B3)

A polymer B3 was obtained in the same manner as in Synthesis Example 1, except for using 20 g of N,N-dimethylacrylamide (monomer Bm1, manufactured by Kojin Co., Ltd.) and 80 g of methyl methacrylate (monomer Bm2, manufactured by Mitsubishi Materials Corp.).

The polymer B3 had an Mw of 9000. The polymer B3 is a resin including the structural unit shown by the formula (1).

Synthesis Example 4 (Synthesis of polymer B4)

A polymer B4 was obtained in the same manner as in Synthesis Example 1, except for using acryloylmorpholine shown by the following formula (8) (monomer Bm1, manufactured by Kohjin Co., Ltd.) instead of N,N-dimethylacrylamide.

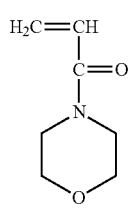

(8)

The polymer B4 had an Mw of 9500. The polymer B4 is a resin including the structural unit shown by the formula (1).

Synthesis Example 5 (Synthesis of polymer B5)

A polymer B5 was obtained in the same manner as in Synthesis Example 4, except for using 10 g of acryloylmorpholine (monomer Bm1, manufactured by Kojin Co., Ltd.) and 90 g of methyl methacrylate (monomer Bm2, manufactured by Mitsubishi Materials Corp.).

The polymer B5 had an Mw of 10,500. The polymer B5 is a resin including the structural unit shown by the formula (1).

Synthesis Example 6 (Synthesis of polymer B6)

A polymer B6 was obtained in the same manner as in Synthesis Example 4, except for using 20 g of acryloylmorpholine (monomer Bm1, manufactured by Kojin Co., Ltd.) and 80 g of methyl methacrylate (monomer Bm2, manufactured by Mitsubishi Materials Corp.).

The polymer B6 had an Mw of 10,000. The polymer B6 is a resin including the structural unit shown by the formula (1).

Synthesis Example 7 (Synthesis of polymer B7)

A polymer B7 was obtained in the same manner as in Synthesis Example 1, except for using 100 g of methyl methacrylate (monomer Bm2, manufactured by Mitsubishi Materials Corp.) without using the monomer Bm1.

The polymer B7 had an Mw of 15,000. The polymer B7 is a resin that does not include the structural unit shown by the formula (1).

Synthesis Example 8 (Synthesis of polymer B8)

A polymer B8 was obtained in the same manner as in Synthesis Example 1, except for using 80 g of methyl methacrylate (monomer Bm2, manufactured by Mitsubishi Materials Corp.) and 20 g of isobornyl acrylate (manufactured by Osaka Organic Chemical Industry Ltd.) without using the monomer Bm1.

The polymer B8 had an Mw of 12,000. The polymer B8 is a resin that does not include the structural unit shown by the formula (1).

TABLE 1

Monomers of polymers B1 to B8

| Polymer B | Component (parts by mass) | | | | Weight average molecular weight |
|---|---|---|---|---|---|
| | a | b | c | d | |
| B1 | 5 | — | 95 | — | 11000 |
| B2 | 10 | — | 90 | — | 10000 |
| B3 | 20 | — | 80 | — | 9000 |
| B4 | — | 5 | 95 | — | 9500 |
| B5 | — | 10 | 90 | — | 10000 |
| B6 | — | 20 | 80 | — | 10000 |
| B7 | — | — | 100 | — | 15000 |
| B8 | — | — | 80 | 20 | 12000 |

(a) N,N-Dimethylacrylamide
(b) Acryloylmorpholine
(c) Methyl methacrylate
(d) Isobornyl methacrylate (2) Mixture with Other Components 3 parts by mass of 4,7-di-n-butoxynaphthyltetrahydrothiophenium trifluoromethanesulfonate (acid generator (A)), 100 parts by mass of the polymer (B) (polymers B1 to B8) obtained in (1), 2000 parts by mass of propylene glycol monomethyl ether acetate (solvent (C)), and 0.05 parts by mass of "NBX-15" (surfactant (D), manufactured by NEOS Co., Ltd.) were mixed, and stirred to obtain a homogenous solution. The solution was filtered through a capsule filter (pore size: 0.5 μm) to obtain an acid transfer resin film-forming composition (Experimental Examples 1 to 13).

TABLE 2

Composition of acid transfer resin film-forming composition

| Experimental Example | Acid generator (A) Parts by mass | Polymer (B) | | Organic solvent (C) Parts by mass | Surfactant (D) Parts by mass |
|---|---|---|---|---|---|
| | | Type | Parts by mass | | |
| 1 | 3 | B1 | 100 | 2000 | 0.05 |
| 2 | 3 | B2 | 100 | 2000 | 0.05 |

TABLE 2-continued

Composition of acid transfer resin film-forming composition

| Experimental Example | Acid generator (A) Parts by mass | Polymer (B) Type | Polymer (B) Parts by mass | Organic solvent (C) Parts by mass | Surfactant (D) Parts by mass |
|---|---|---|---|---|---|
| 3 | 3 | B3 | 100 | 2000 | 0.05 |
| 4 | 3 | B4 | 100 | 2000 | 0.05 |
| 5 | 3 | B5 | 100 | 2000 | 0.05 |
| 6 | 3 | B6 | 100 | 2000 | 0.05 |
| 7 | 3 | B7 | 100 | 2000 | 0.05 |
| 8 | 3 | B8 | 100 | 2000 | 0.05 |
| 9 | 20 | B1 | 100 | 2000 | 0.05 |
| 10 | 20 | B2 | 100 | 2000 | 0.05 |
| 11 | 20 | B3 | 100 | 2000 | 0.05 |
| 12 | 20 | B4 | 100 | 2000 | 0.05 |
| 13 | 20 | B1 | 100 | 2000 | 0.05 |

[3] Pattern-Forming Method (1) Patterning Target Film-Forming Step

The patterning target film-forming composition obtained in [1] was applied to the surface of a silicon substrate using a spin coater. The composition was heated at 110° C. for 1 minute on a hot plate to form a patterning target film (first film) having a thickness of 200 nm.

(2) Acid Transfer Film-Forming Step (I)

The acid transfer film-forming composition obtained in [2] and including one of the polymers B1 to B8 was applied to the surface of the patterning target film obtained in [2] using a spin coater. The composition was heated at 110° C. for 1 minute on a hot plate to form an acid transfer film having a thickness of 150 nm.

(3) Exposure Step (II)

The surface of the acid transfer film obtained in (2) was exposed to ultraviolet rays via a pattern mask at a dose of 100 to 1000 mJ/cm$^2$ using an ultra-high-pressure mercury lamp ("HBO" manufactured by OSRAM, output: 1000 W). The dose was measured using an illuminometer ("UV-M10" manufactured by ORC Manufacturing Co., Ltd.) connected to a photodetector "Probe UV-35".

(4) Acid Transfer Step (III)

The laminate obtained in (3) was heated at 110° C. for 1 minute on a hot plate.

(5) Acid Transfer Film-Removing Step (IV)

The laminate obtained in (4) was immersed in acetonitrile for 30 seconds to remove only the acid transfer film.

(6) Development Step (V)

The laminate obtained in (5) was immersed in a 2.38 mass % tetramethylammonium hydroxide aqueous solution at room temperature for 1 minute (development). The laminate was then washed in running water, and subjected to nitrogen blowing to obtain a pattern.

The substrate on which the pattern was thus formed is hereinafter referred to as "patterned substrate".

[4] Sensitivity Evaluation

The sensitivity was evaluated by observing the patterned substrate using an optical microscope. The term "sensitivity" used herein refers to a minimum dose at which a 50/50 μm line/space pattern is resolved without producing a residue. The minimum dose was taken as "optimum dose". The results are shown in Table 3.

[5] Dimensional Evaluation

The patterned substrate exposed at the optimum dose was observed using a scanning electron microscope to measure the dimensions of the 50/50 μm line/space pattern. A case where the difference between the measured dimensions and the mask dimensions was 0 to 5 μm was evaluated as "Good", and a case where the difference between the measured dimensions and the mask dimensions was 5 μm or more was evaluated as "Bad". The results are shown in Table 3.

TABLE 3

| Experimental Example | Sensitivity (mJ · cm$^{-2}$) | Dimensional evaluation |
|---|---|---|
| 1 | 150 | Good |
| 2 | 300 | Good |
| 3 | 800 | Good |
| 4 | 100 | Good |
| 5 | 250 | Good |
| 6 | 500 | Good |
| 7 | 50 | Bad |
| 8 | 50 | Bad |
| 9 | 100 | Good |
| 10 | 150 | Good |
| 11 | 300 | Good |
| 12 | 80 | Good |
| 13 | 50 | Good |

The method according to the embodiment of the present invention includes (V) contacting the first film with an alkaline solution (hereinafzter may be referred to as "alkaline solution contact step") after removing the second film.

In the method according to the embodiment of the present invention, the second film includes (A) the photoacid generator, and (B) a polymer that includes a nitrogen-containing group in its side chain.

In the method according to the embodiment of the present invention, the polymer (B) includes a structural unit shown by the following formula (1),

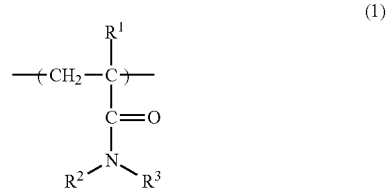

wherein $R^1$ represents a hydrogen atom or a methyl group, and $R^2$ and $R^3$ individually represent a hydrogen atom, a linear or branched hydrocarbon group having 1 to 10 carbon atoms, or a cyclic hydrocarbon group having 3 to 10 carbon atoms, provided that $R^2$ and $R^3$ may bond to form a 3 to 10-membered monocyclic hetero ring that includes a nitrogen atom, an oxygen atom, a sulfur atom, or a selenium atom.

In the method according to the embodiment of the present invention, the polymer (B) further includes a structural unit shown by the following formula (2),

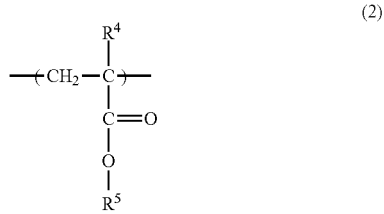

wherein $R^4$ represents a hydrogen atom or a methyl group, and $R^5$ represents a monovalent organic group.

In the method according to the embodiment of the present invention, the second film includes the photoacid generator (A) in an amount of 20 to 100 parts by mass based on 100 parts by mass of the polymer (B).

The method according to the embodiment of the present invention includes patterning the first film.

In the acid transfer resin film-forming composition according to the embodiment of the present invention, the polymer (B) includes a structural unit shown by the following formula (1),

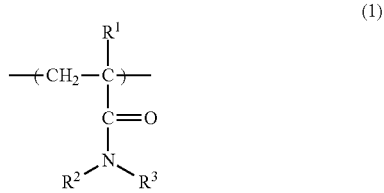

wherein $R^1$ represents a hydrogen atom or a methyl group, and $R^2$ and $R^3$ individually represent a hydrogen atom, a linear or branched hydrocarbon group having 1 to 10 carbon atoms, or a cyclic hydrocarbon group having 3 to 10 carbon atoms, provided that $R^2$ and $R^3$ may bond to form a 3 to 10-membered monocyclic hetero ring that includes a nitrogen atom, an oxygen atom, a sulfur atom, or a selenium atom.

In the acid transfer resin film-forming composition according to the embodiment of the present invention, the polymer (B) further includes a structural unit shown by the following formula (2),

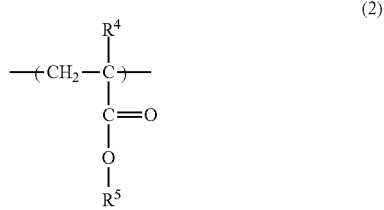

wherein $R^4$ represents a hydrogen atom or a methyl group, and $R^5$ represents a monovalent organic group.

In the acid transfer resin film-forming composition according to the embodiment of the present invention, the content of the photoacid generator (A) is 20 to 100 parts by mass based on 100 parts by mass of the polymer (B).

The above first film-modifying method can modify the first film using the second film. In particular, the above first film-modifying method can modify the first film using a photolithographic process even if the first film does not include an acid generator.

When the first film-modifying method includes (V) contacting the first film with an alkaline solution (alkaline solution contact step) after removing the second film, the modification state of the first film becomes evident. In particular, when the first film-modifying method includes developing the first film using an alkaline developer, a pattern can be formed based on the presence or absence of the resin (i.e., a pattern can be formed by the remaining area of the first film).

When the second film includes the photoacid generator (A) and the polymer (B) that includes a nitrogen-containing group in its side chain, undesirable diffusion of the acid generated by the second film can be suppressed even when forming a fine line/space pattern. Therefore, a fine pattern can be resolved.

When the polymer (B) includes the structural unit shown by the formula (1), undesirable diffusion of the acid generated by the second film can be suppressed due to the structural unit shown by the formula (1), even when forming a fine line/space pattern. Therefore, a fine pattern can be resolved.

When the polymer (B) further includes the structural unit shown by the formula (2), the transfer efficiency of the acid generated by the second film can be advantageously controlled.

When the second film includes the photoacid generator (A) in an amount of 20 to 100 parts by mass based on 100 parts by mass of the polymer (B), the effects of the first film-modifying method can be effectively obtained.

When the first film-modifying method is a pattern-forming method that patterns the first film, the effects of the first film-modifying method can be effectively obtained.

The above acid transfer resin film-forming composition allows the first film to be modified using the second film. In particular, the first film can be modified using a photolithographic process even if the first film does not include an acid generator.

When the polymer (B) includes the structural unit shown by the formula (1), undesirable diffusion of the acid generated by the second film can be suppressed due to the structural unit shown by the formula (1), even when forming a fine line/space pattern. Therefore, a fine pattern can be resolved.

When the polymer (B) further includes the structural unit shown by the formula (2), the transfer efficiency of the acid generated by the second film can be advantageously controlled.

When the content of the photoacid generator (A) is 20 to 100 parts by mass based on 100 parts by mass of the polymer (B), the effects of the first film-modifying method can be effectively obtained.

Obviously, numerous modifications and variations of the present invention are possible in light of the above teachings. It is therefore to be understood that within the scope of the appended claims, the invention may be practiced otherwise than as specifically described herein.

The invention claimed is:
1. A first film-modifying method comprising:
preparing a first film which includes an acid-dissociable group and which does not include a photoacid generator;
forming a second film on the first film, the second film including a photoacid generator and a polymer which does not include an acid-dissociable group, the polymer including a structural unit shown by a following formula (1);
exposing the second film via a mask so that the second film generates an acid;
transferring the acid generated by the second film to the first film;

removing the second film from the first film; and
contacting the first film with an alkaline solution to develop the first film after removing the second film,

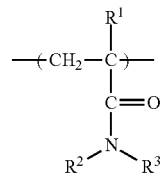
(1)

wherein $R^1$ represents a hydrogen atom or a methyl group, and each of $R^2$ and $R^3$ represents a hydrogen atom, a linear or branched hydrocarbon group having 1 to 10 carbon atoms, or a cyclic hydrocarbon group having 3 to 10 carbon atoms, provided that $R^2$ and $R^3$ may bond to form a 3 to 10-membered monocyclic hetero ring that comprises a nitrogen atom, an oxygen atom, a sulfur atom, or a selenium atom.

2. The method according to claim 1, wherein the polymer further comprises a structural unit shown by a following formula (2),

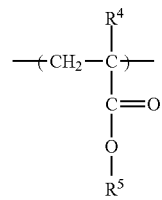
(2)

wherein $R^4$ represents a hydrogen atom or a methyl group, and $R^5$ represents a monovalent organic group.

3. The method according to claim 2, wherein the second film comprises the photoacid generator in an amount of 20 to 100 parts by mass based on 100 parts by mass of the polymer.

4. The method according to claim 3, further comprising patterning the first film.

5. The method according to claim 2, further comprising patterning the first film.

6. The method according to claim 2, wherein an acid-dissociable group is excluded from the monovalent organic group represented by $R^5$.

7. The method according to claim 1, wherein the second film comprises the photoacid generator in an amount of 20 to 100 parts by mass based on 100 parts by mass of the polymer.

8. The method according to claim 7, further comprising patterning the first film.

9. The method according to claims 1, further comprising patterning the first film.

10. An acid transfer resin film-forming composition comprising:
a photoacid generator, and
a polymer that comprises a structural unit shown by a following formula (1),

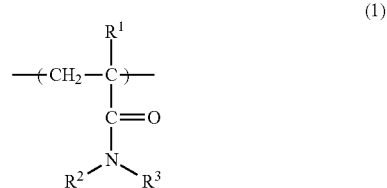
(1)

wherein $R^1$ represents a hydrogen atom or a methyl group, and each of $R^2$ and $R^3$ represents a hydrogen atom, a linear or branched hydrocarbon group having 1 to 10 carbon atoms, or a cyclic hydrocarbon group having 3 to 10 carbon atoms, provided that $R^2$ and $R^3$ may bond to form a 3 to 10-membered monocyclic hetero ring that includes a nitrogen atom, an oxygen atom, a sulfur atom, or a selenium atom, and
wherein a content of the photoacid generator is 20 to 100 parts by mass based on 100 parts by mass of the polymer.

11. The acid transfer resin film-forming composition according to claim 10, wherein the polymer further comprises a structural unit shown by a following formula (2),

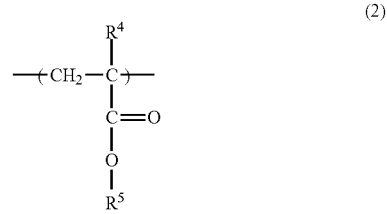
(2)

wherein $R^4$ represents a hydrogen atom or a methyl group, and $R^5$ represents a monovalent organic group.

12. The acid transfer resin film-forming composition according to claim 10, wherein a content of the structural unit shown by the formula (1) included in the polymer is from 1 to 50 mol % based on total structural units of the polymer.

* * * * *